(12) United States Patent
Bacchu et al.

(10) Patent No.: US 9,923,572 B2
(45) Date of Patent: Mar. 20, 2018

(54) DELTA MODULATOR RECEIVE CHANNEL FOR CAPACITANCE MEASUREMENT CIRCUITS

(71) Applicant: Cypress Semiconductor Corporation, San Jose, CA (US)

(72) Inventors: Rishi Raghav Bacchu, San Jose, CA (US); Kaveh Hosseini, Cork (IE); Dermot MacSweeney, Cork (IE); Paul M. Walsh, Cork (IE); Kofi Makinwa, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/087,625

(22) Filed: Mar. 31, 2016

(65) Prior Publication Data

US 2017/0141787 A1 May 18, 2017

Related U.S. Application Data

(60) Provisional application No. 62/257,113, filed on Nov. 18, 2015.

(51) Int. Cl.
| | |
|---|---|
| *H03M 3/00* | (2006.01) |
| *G01R 27/26* | (2006.01) |
| *H03F 3/45* | (2006.01) |
| *H03M 3/02* | (2006.01) |

(52) U.S. Cl.
CPC ........ *H03M 3/322* (2013.01); *G01R 27/2605* (2013.01); *H03F 3/45071* (2013.01); *H03F 3/45475* (2013.01); *H03M 3/424* (2013.01); *H03F 2200/129* (2013.01); *H03F 2203/45146* (2013.01); *H03F 2203/45288* (2013.01); *H03F 2203/45522* (2013.01); *H03M 3/02* (2013.01)

(58) Field of Classification Search
None
See application file for complete search history.

(56) References Cited

U.S. PATENT DOCUMENTS

| | | | | |
|---|---|---|---|---|
| 5,796,389 | A | 8/1998 | Bertram et al. | |
| 6,473,019 | B1 * | 10/2002 | Ruha | H03M 3/334 341/143 |
| 7,049,990 | B2 * | 5/2006 | Ranganathan | H03M 3/424 341/126 |
| 8,031,094 | B2 | 10/2011 | Hotelling et al. | |
| 8,212,699 | B1 * | 7/2012 | Nilsson | H03M 3/348 341/143 |

(Continued)

FOREIGN PATENT DOCUMENTS

WO 2002025803 A2 3/2002

OTHER PUBLICATIONS

Haze, Jiri, et al., BandPass Sigma-Delta Modulator for Capacitive Pressure Sensor, Jun. 2007, 2 pages.

(Continued)

*Primary Examiner* — Jermele M Hollington

(57) ABSTRACT

A circuit, system, and method for measuring capacitance are described. A current may be received at an input of a conversion circuit. The current may be converted to a voltage signal which may be used to create a negative feedback current to the input of the conversion circuit and which may be demodulated digitally to provide a static digital output representative of a capacitance.

10 Claims, 7 Drawing Sheets

(56) References Cited

U.S. PATENT DOCUMENTS

| | | | |
|---|---|---|---|
| 8,489,666 B1 | 7/2013 | Nikitin | |
| 8,575,947 B1 * | 11/2013 | Walsh | G06F 3/044 |
| | | | 324/658 |
| 8,723,532 B2 | 5/2014 | Asjes et al. | |
| 9,350,380 B2 * | 5/2016 | Chen | H03M 3/38 |
| 2008/0136666 A1 | 6/2008 | Hammerschmidt | |
| 2008/0150777 A1 * | 6/2008 | Rangan | H03M 3/428 |
| | | | 341/143 |
| 2009/0322351 A1 | 12/2009 | McLeod | |
| 2011/0050472 A1 * | 3/2011 | Melanson | H03M 3/474 |
| | | | 341/143 |
| 2012/0194370 A1 * | 8/2012 | Rangan | H03M 3/428 |
| | | | 341/143 |
| 2012/0256869 A1 | 10/2012 | Walsh et al. | |
| 2015/0054772 A1 | 2/2015 | Jain et al. | |
| 2015/0062081 A1 | 3/2015 | Lee et al. | |

OTHER PUBLICATIONS

Park, E., et al, A Reconfigurable 40-to-67 dB SNR, 50-to-6400 Hz Fram-Rate, Column-Parallel Readout IC for Capacitive Touch-Scree Panels, Oct. 2014, 3 pages, IEEE Journal of Solid-State Circuits.

International Search Report for International Application No. PCT/US2016/025540 dated Aug. 31, 2016; 4 pages.

Written Opinion of the International Searching Authority for International Application PCT/US2016/025540 dated Aug. 31, 2016; 6 pages.

\* cited by examiner

DELTA MODULATOR RECEIVE CHANNEL FOR CAPACITANCE MEASUREMENT CIRCUITS

RELATED APPLICATIONS

This patent application claims the benefit of U.S. Provisional Patent Application No. 62/257,113, filed Nov. 18, 2015, which is each incorporated by reference herein in its entirety.

TECHNICAL FIELD

The present disclosure relates generally to sensing systems, and more particularly to capacitance-sensing systems configurable to measure capacitance or convert capacitance to digital values representative of the capacitance.

BACKGROUND

Capacitance sensing systems can sense electrical signals generated on electrodes that reflect changes in capacitance. Such changes in capacitance can indicate a touch event (i.e., the proximity of an object to particular electrodes). Capacitive sense elements may be used to replace mechanical buttons, knobs and other similar mechanical user interface controls. The use of a capacitive sense element allows for the elimination of complicated mechanical switches and buttons, providing reliable operation under harsh conditions. In addition, capacitive sense elements are widely used in modern customer applications, providing new user interface options in existing products. Capacitive sense elements can range from a single button to a large number arranged in the form of a capacitive sense array for a touch-sensing surface.

Transparent touch screens that utilize capacitive sense arrays are ubiquitous in today's industrial and consumer markets. They can be found on cellular phones, GPS devices, set-top boxes, cameras, computer screens, MP3 players, digital tablets, and the like. The capacitive sense arrays work by measuring the capacitance of a capacitive sense element, and looking for a delta in capacitance indicating a touch or presence of a conductive object. When a conductive object (e.g., a finger, hand, or other object) comes into contact or close proximity with a capacitive sense element, the capacitance changes and the conductive object is detected. The capacitance changes of the capacitive touch sense elements can be measured by an electrical circuit. The electrical circuit converts the measured capacitances of the capacitive sense elements into digital values.

There are two typical types of capacitance: 1) mutual capacitance where the capacitance-sensing circuit has access to both electrodes of the capacitor; 2) self capacitance where the capacitance-sensing circuit has only access to one electrode of the capacitor where the second electrode is tied to a DC voltage level or is parasitically coupled to Earth Ground. A touch panel has a distributed load of capacitance of both types (1) and (2) and some touch solutions sense both capacitances either uniquely or in hybrid form with its various sense modes.

DETAILED DESCRIPTION

Figure 1:
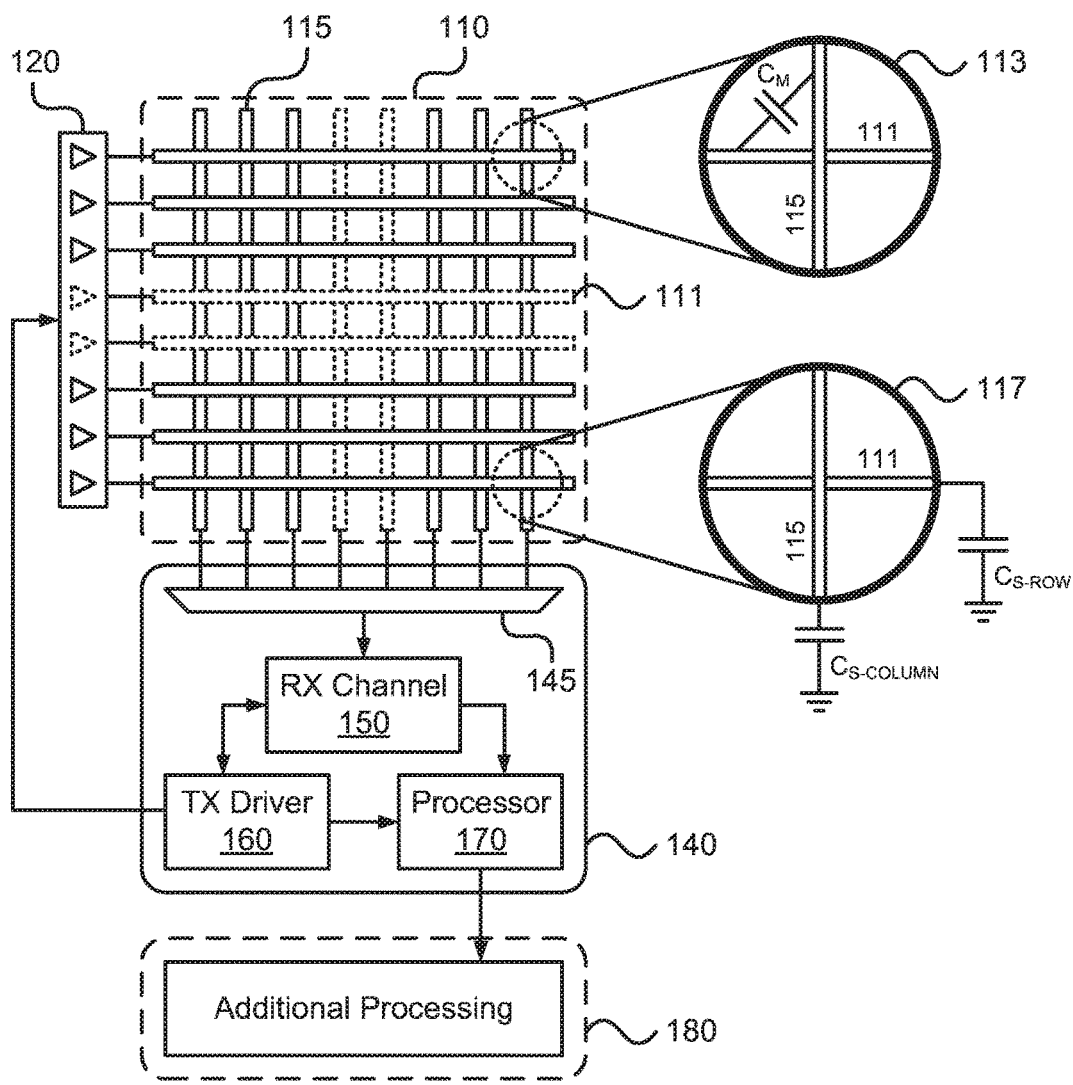
FIG. 1 illustrates a capacitance measurement system, according to one embodiment.

FIG. 1 illustrates a capacitance measurement system 100 including a panel 110 and a capacitance measurement circuit 140. Panel 110 may include a plurality of row electrodes 111 and a plurality of column electrodes 115. In the embodiment of FIG. 1, there are eight row electrodes 111 and eight column electrodes 115, however one of ordinary skill in the art would understand that more or fewer than eight electrodes on each axis may be used. Similarly, while the same number of row electrodes 111 and column electrodes 115 are shown, in various embodiments, the number of row electrodes and the number of column electrodes may be different.

Capacitance measurement system 100 may be configured to measure either mutual capacitance or self capacitance, depending on application requirements. A mutual capacitance, $C_M$, may be formed between electrodes of different axis. A mutual capacitance, $C_M$, between a row electrode 111 and a column electrode 115 is shown in cutout 113. Mutual capacitance CM may be formed by two electrodes disposed adjacent to each other, though not necessarily intersecting. A self capacitance, $C_S$, of a single electrode may be formed between the electrode and the surrounding circuit elements, including a ground electrode. Self capacitances, $C_{S\text{-}column}$ and $C_{S\text{-}row}$, are shown for row electrode 111 and column electrode 115, respectively, in cutout 117. For self capacitance measurement, electrodes may be disposed so that none interest with eachother. In this embodiment, self capacitance electrodes may be configured as pads or discrete electrodes with a capacitance to ground or other circuit voltage potentials. Self capacitance electrodes may take the form of circles, ellipses, squares, rectangles, or have any of a variety of other shapes that are optimized for system requirements. In one embodiment, capacitance measurement system 100 may be configured to switch between a mutual capacitance sensing mode and a self capacitance sensing mode based on application requirements. In still another embodiment, capacitance measurement system 100 may be fixed as either a mutual capacitance measurement system or a self capacitance measurement system.

Capacitance measurement system 100 may include a capacitance measurement circuit 140 coupled to column electrodes 115. Each of the column electrodes 115 may be coupled to RX channel 150 through an input multiplexer 145. The embodiment illustrated in FIG. 1 is that of a mutual capacitance measurement circuit. In this embodiment, only one electrode of the mutual capacitor formed between a row electrode 111 and a column electrode 115 is coupled to the RX channel 150. In a self capacitance measurement circuit, row electrodes 111 may also be coupled to RX channel 150 through a multiplexer similar to input multiplexer 145. A second multiplexer for row electrodes 111 is not shown for clarity of explanation.

When capacitance measurement system 100 is configured to measure mutual capacitance, row electrodes may be coupled to driver buffers 120 for providing a drive signal, TX, to one electrode of a mutual capacitance (shown in detail in cutout 113). While only eight drive buffers 120 are shown in FIG. 1, one or ordinary skill in the art would understand that at least one drive buffer 120 may be used for each electrode to be driven. The signal provided to the drive electrodes may be provided by TX driver 160, which shares a clock source with RX channel 150 to ensure that the drive and receive operations of capacitance measurement circuit 140 are synchronized. Both RX channel 150 and TX driver 160 may be coupled to processor 170, which may be configured to convert signals received on RX channel to digital values representative of capacitances on panel 110 (mutual capacitances, $C_M$, between row electrodes 111 and column electrodes 115 and self capacitances, $C_S$, between row electrodes and ground and column electrodes and ground). Processor 170 may be coupled to additional processing logic 180 to complete capacitance measurement, determine presence/absence of a conductive object, or perform other processing functions. In various embodiments, additional processing logic may be implemented on the same integrated circuit as capacitance measurement circuit 140 or it may be implemented on a separate integrated circuit. Additionally, various circuit elements of capacitance measurement circuit 140 may be implemented on different integrated circuits, although this is not shown in FIG. 1.

In mutual capacitance sensing, a single axis may be coupled to RX channel 150. While FIG. 1 illustrates that column electrodes 115 are coupled to RX channel 150 and column electrodes 111 are coupled to TX driver 160, one of ordinary skill in the art would understand that this relationship may be switched. In one embodiment, row electrodes 111 may be coupled to RX channel 150 and row electrodes 115 may be coupled to TX driver 160. Additionally, the relationship of row electrodes 111 and column electrodes to the various elements of capacitance measurement circuit 140 need not be static. In one embodiment, the connections of row electrodes 111 and column electrodes 115 may switching during run time, depending on the system requirements.

Figure 2:
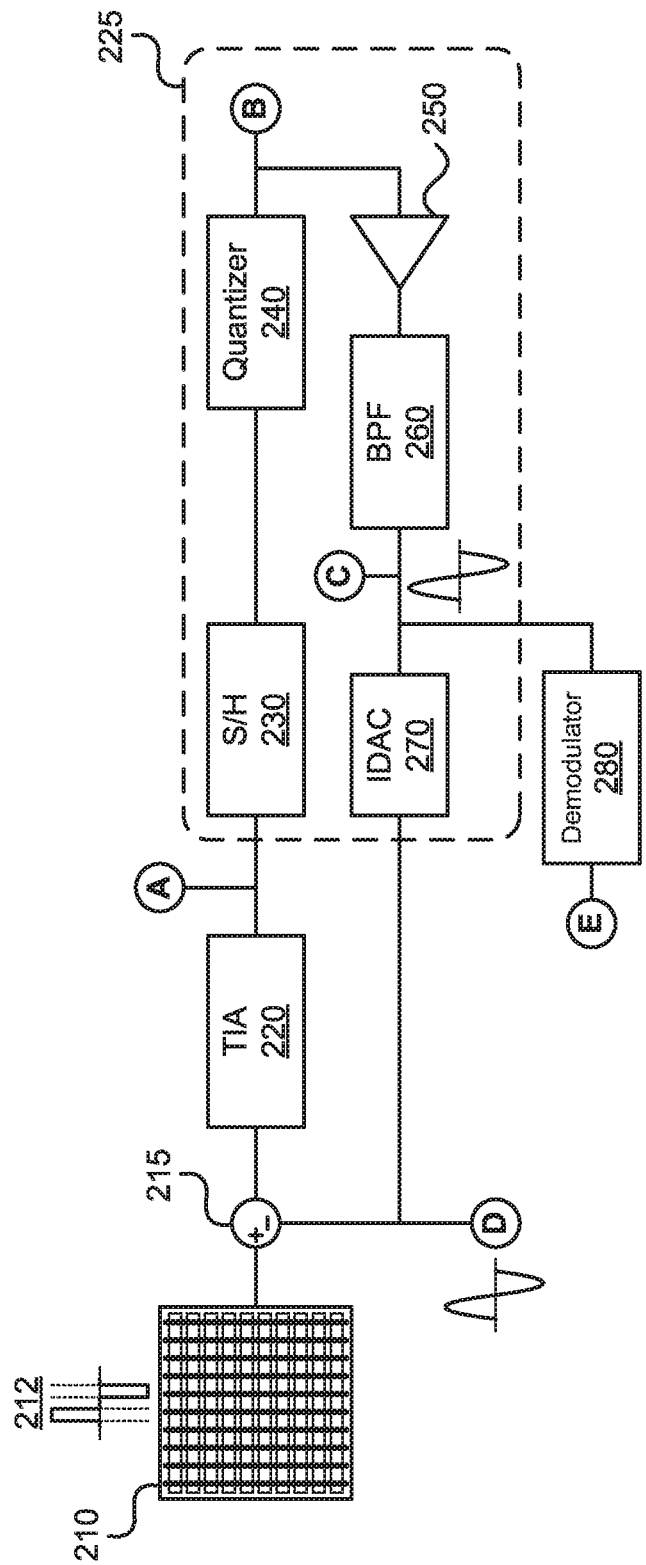
FIG. 2 illustrates block diagram of a delta modulator receive (RX) channel, according to one embodiment.

FIG. 2 illustrates one embodiment of a delta modulator receive (RX) channel 200. Delta modulator RX channel 200 may correspond to RX channel 150 of FIG. 1. Panel 210 may correspond to panel 110 of FIG. 1. Receive electrodes of a capacitance sensing panel 210 (column electrodes 115 of FIG. 1) may be coupled to an input of a transimpedance amplifier (TIA) 220 through summing junction 215. TIA 220 may convert receive signal 212 on the receive electrodes of capacitance sensing panel 210 to a voltage at an output (node A). In one embodiment, receive signal may be an induced current on the receive electrodes. The output of TIA 220 may be coupled to a negative feedback loop 225. A negative feedback loop 225 may include a sample and hold (S/H) element 230, a quantizer 240, a buffer 250, a bandpass filter (BPF) 260, and a current digital-to-analog converter (IDAC) 270). Negative feedback loop 225 may generate a current that is coupled to the input of TIA 220 through summing junction 215. In this embodiment, the TIA converts the combined current of the induced current on the receive electrode of panel 210 and the current from IDAC 270 of negative feedback loop 225. Negative feedback loop 225 may generate a sine wave output at feedback element 215 (node D). In embodiments where the presence of a conductive element on panel 210 reduces the panel current at the input of TIA 220, the negative feedback loop responds by decreasing the amplitude of the signal input at summing junction 215 (node D). In embodiments where the presence of a conductive object on panel 210 increases the panel current at the input of TIA 220, negative feedback loop responds by increasing the amplitude of the signal at summing junction 215 (node D). A digital representation of the received signal may be received by demodulator 280 at the output of bandpass filter 260 (node C).

Figure 3:
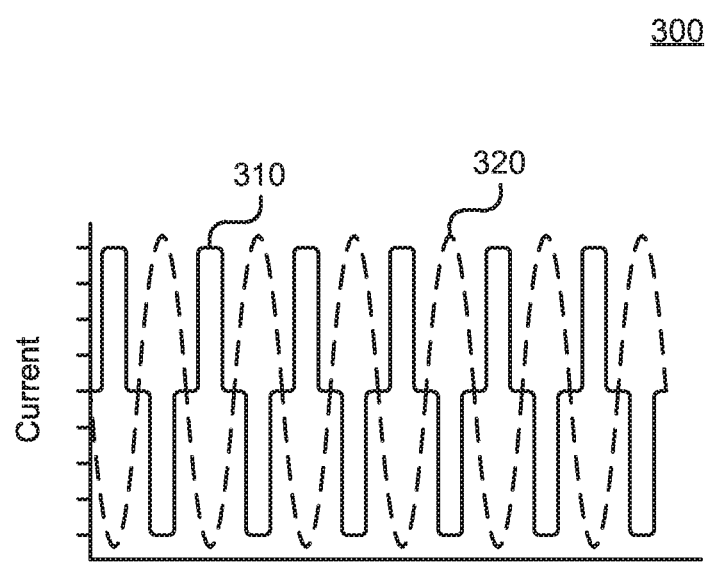
FIG. 3 illustrates panel waveforms and compensation waveforms of a delta modulator RX channel, according to one embodiment.

In one embodiment, quantizer 240 may oversample the TX input. The TX frequency on panel 210 may be 500 kHz, while the quantizer frequency (provided by a system clock, not shown) may be 6 MHz. In other embodiments, higher quantizer frequencies may be used (and provided by other clock sources). Higher oversampling ratios may provide better resolution from the receive channel FIG. 3 illustrates an embodiment 300 of current waveforms for panel 210 and the output of BPF 250 of FIG. 2. The current on the receive electrode of panel 210 may be a square wave similar to waveform 310. The corresponding current waveform of the output of BPF 260 is shown by sine wave waveform 320. Waveform 320 may be used to increase or decrease the current input to TIA 220 through summing junction 215 by providing an input signal to IDAC 270.

Figure 4:
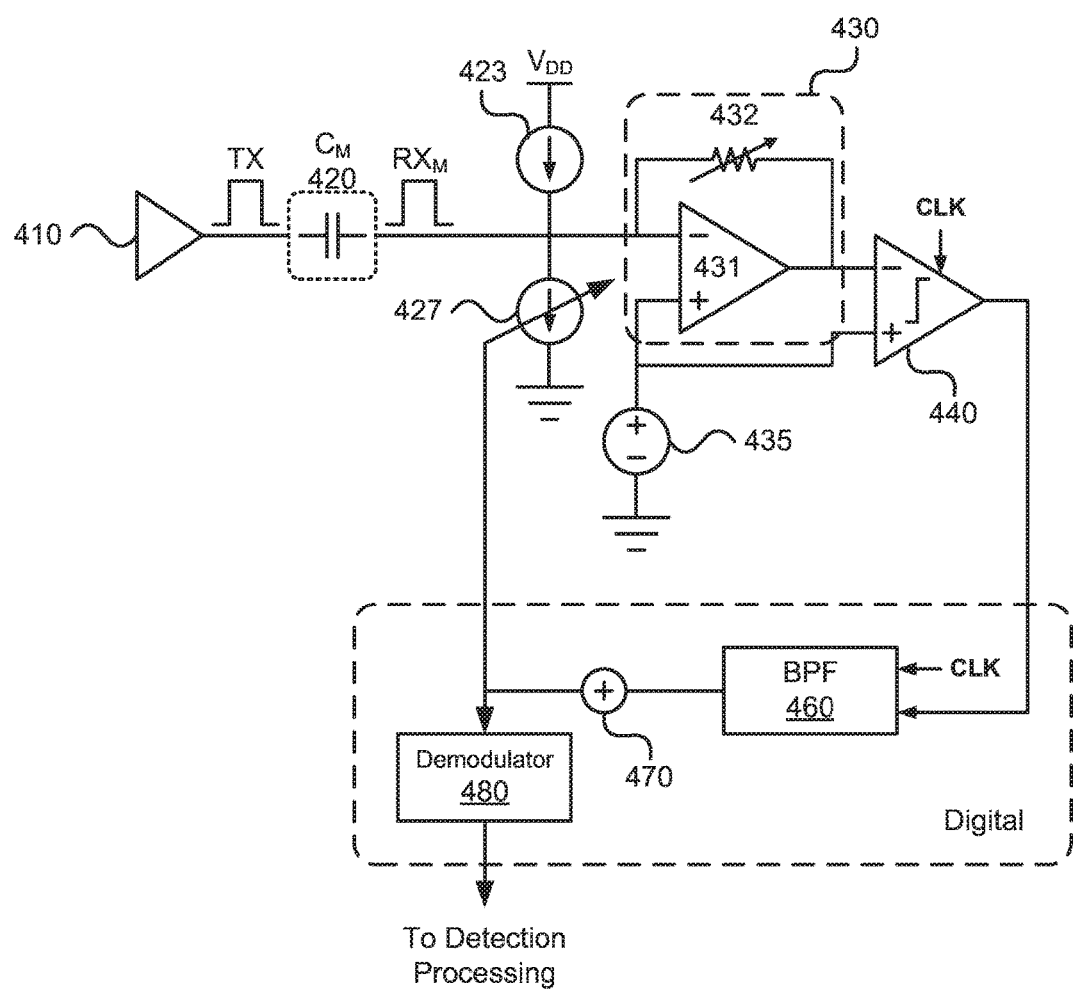
FIG. 4 illustrates a delta modulator receive channel configured to measure mutual capacitance, according to one embodiment.

FIG. 4 illustrates another embodiment of a delta modulator RX channel 400 for mutual capacitance sensing. TX buffer 410 may apply a transmit signal, TX, on a first electrode. A receive signal, RX, may be received on a second electrode and input to TIA 430. The first and second electrodes may be in close proximity, or may intersect, forming a mutual capacitance therebetween. Receive signal, $RX_M$, may be derived from the transmit signal, TX, and the mutual capacitance between the first and second electrodes. In one embodiment, receive signal $RX_M$ may be a current induced on the second electrode. TIA 430 may include an operational amplifier (opamp) 431 with a feedback resistor 432. A first (negative) input of opamp 431 may be coupled to the receive electrode, while a second (positive) input may be coupled to a reference voltage 435. In one embodiment, reference voltage 435 may be one half of the supply voltage, or $V_{DD}/2$. IDACs 423 and 427 may be configured to provide source current and sink current, respectively, to the negative input of TIA 430, which is coupled to the second electrode. While FIG. 4 illustrates variability of the sink current IDAC 427, in another embodiment, source current IDAC 423 may be variable. In still another embodiment, variable control of both source current IDAC 423 and sink current IDAC 427 may be used. In this embodiment, a programmable IDAC resolution may be changed to accommodate the input signal to TIA 430. In another embodiment, source current IDAC 423 and sink current IDAC 427 may have different LSBs to compensate for different signal levels at negative input of opamp 431.

Delta modulator RX channel 400 may include comparator 440 coupled to the output of TIA 430. In one embodiment, comparator 440 may represent S/H 230 and quantizer 240 of FIG. 2. The output of TIA 430 may be coupled to a first (negative) input of comparator 440. A second (positive) input of comparator 440 may be coupled to reference voltage 435, just as is the second (positive) input of TIA 430. As described above with regard to FIG. 2, comparator 440 (which represents S/H 230 and quantizer 240 of FIG. 2) may be oversampled with a clock frequency, CLK, far greater than the frequency of panel 210, also referred to as the transmit signal, TX. The output of comparator 440 may be coupled to BPF 460. BPF may be configured to extract the fundamental signal from the comparator bit stream (node B of FIG. 2). The fundamental signal may have the same frequency as the transmit signal, TX. Demodulator 480 may be coupled to the output of BPF 460 and configured to output an absolute value of the digital bit stream. While RX channel 400 is illustrated with a BPF, other filter types may be used. In one embodiment, a low pass filter (LPF) may be used.

Demodulator 480 may operate by receiving a digital code from adder 470. Add 470 may provide a digital offset configured to produce a nominal zero current from the output of the IDAC (source current IDAC 423 and sink current IDAC 427). In one embodiment, a fixed source current on source current IDAC 423 and a variable sink current on IDAC 427 may be used. In this embodiment, adder 470 may provide an offset to sink the fixed source current from source current IDAC 423, thereby cancelling the fixed source current and outputting a net zero current. In another embodiment, both the source current and the sink current may be programmable, with upper and lower bits from BPF 460 to drive the source current and sink current, respectively.

The code from adder 470 may be converted from a dynamic signal to a static signal. The code from adder 470 may be converted to a static signal by multiplying it by a pattern. In one embodiment, the switching current on the output of BPF 460 may have the following pattern, or code: +2, −2, +2, −2, +2, −2, +2. Demodulator 480 may multiply the output of BPF 460 by the following pattern, or code: +1, −1, +1, −1, +1, −1, +1. The output of demodulator 480 may therefore be: +2, +2, +2, +2, +2, +2, +2. The output of demodulator 480 is therefore static.

The static output of demodulator 480 may be used to determine the presence or absence of a conductive object on the panel according to various methods known in the art, including but not limited to baseline difference calculation. Baseline difference calculation may compare the output of demodulator 480 to a baseline value representative of an absence of a conductive object on mutual capacitance $C_M$ 420 (panel 210 of FIG. 2). If the difference between the output of the demodulator and the baseline value is great enough, a conductive object may be determined to be proximate to the mutual capacitance $C_M$ 420.

In one embodiment, BPF 460 may have a pass band centered on the frequency of transmit signal TX. In this embodiment, BPF 460 may pass the transmit signal TX, but reject signals with frequencies outside that band. BPF 460 may be digital and implemented with a biquad. The biquad may be programmed to implement multiple filter topologies, including but not limited to band pass and low pass filters.

Figure 5:
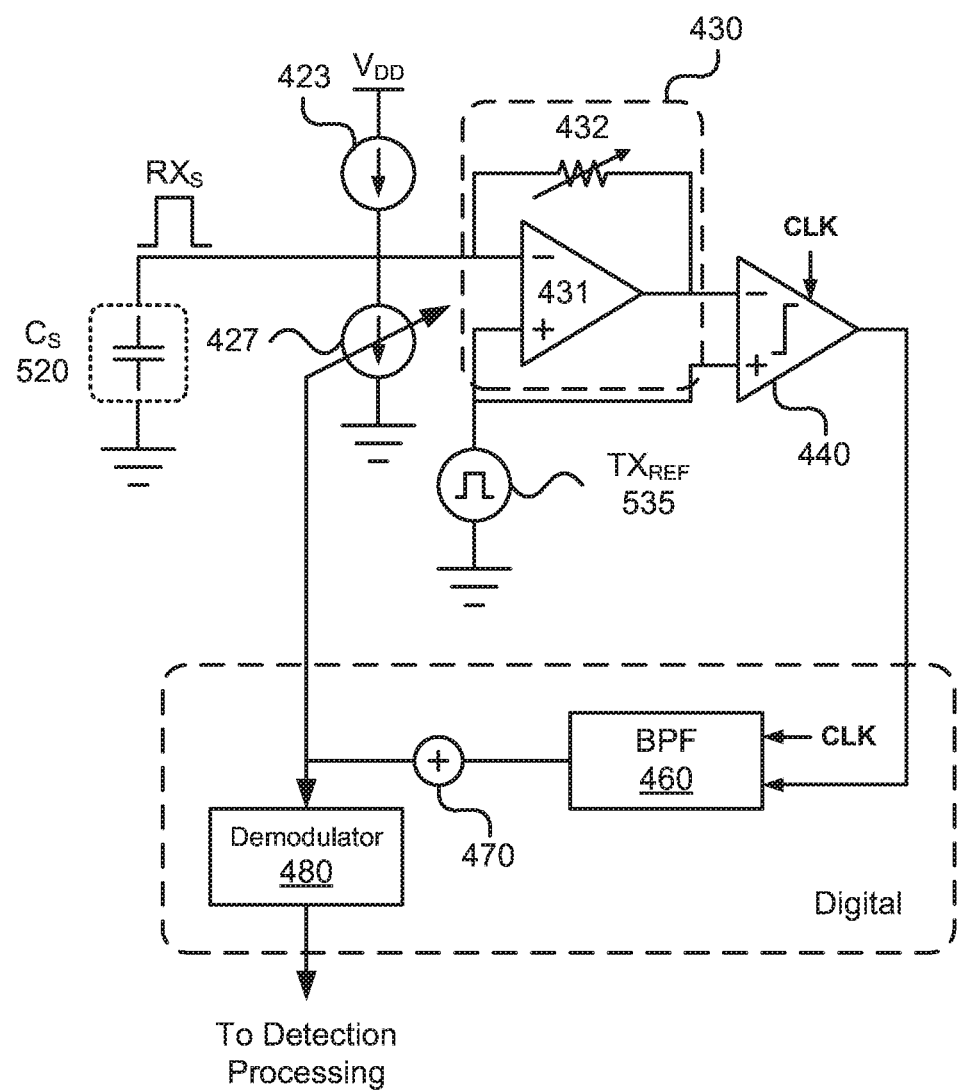
FIG. 5 illustrates a delta modulator receive channel configured to measure self capacitance, according to one embodiment.

FIG. 5 illustrates an embodiment of a delta modulator RX channel 500, which is similar to delta modulator RX channel 400 of FIG. 4, but is configured to operate with self capacitance measurement electrodes. A self capacitance 520 may be coupled to the negative input of TIA 430. Self capacitance 520 may be configured to provide a receive signal, $RX_S$, to the input of TIA 430. The positive input of TIA 430 may be coupled to a reference signal, $TX_{REF}$, 535. Reference signal $TX_{REF}$ may generate an induced current, receive signal $RX_S$, on the input of TIA 430. As the input voltage on the positive input of TIA 430 is modulated, TIA 430 may attempt to maintain a DC voltage on its output (through resistor 432). The output voltage of TIA 430 may therefore change, generating a signal equivalent to the input current multiplied by the resistance of feedback resistor 432, or $I_{IN}*R_{FB}$. The output of TIA 430 may be coupled to comparator 440, as discussed above with regard to FIG. 4.

The positive input of comparator 440 may be coupled to reference signal $TX_{REF}$. The bitstream output of comparator 440 may be filtered through BPF 460 and demodulated through demodulator 480, as discussed above with regard to FIG. 4. In the embodiment of FIG. 5, reference signal $TX_{REF}$ 535 may be chosen based on system noise characteristics to provide greater immunity from periodic noise sources. In this embodiment, noise immunity may be achieved by not operating at the same frequency as a noise carrier (not shown). The output of demodulator 480 may be used to determine the presence or absence of a conductive object on the panel according to various methods known in the art, including but not limited to baseline difference calculation, described above with regard to FIG. 4.

For the embodiments of FIGS. 4 and 5, higher amplitude in transmit signal TX (FIG. 4) and $TX_{REF}$ (FIG. 5) may produce higher signal-to-noise ratio (SNR). It may be desireable to operate transmit signal TX and $TX_{REF}$ at the highest possible amplitudes. In still other embodiments, the amplitude of transmit signal TX and $TX_{REF}$ may be programmable and may be set to strengths optimized for system performance.

Figure 6:
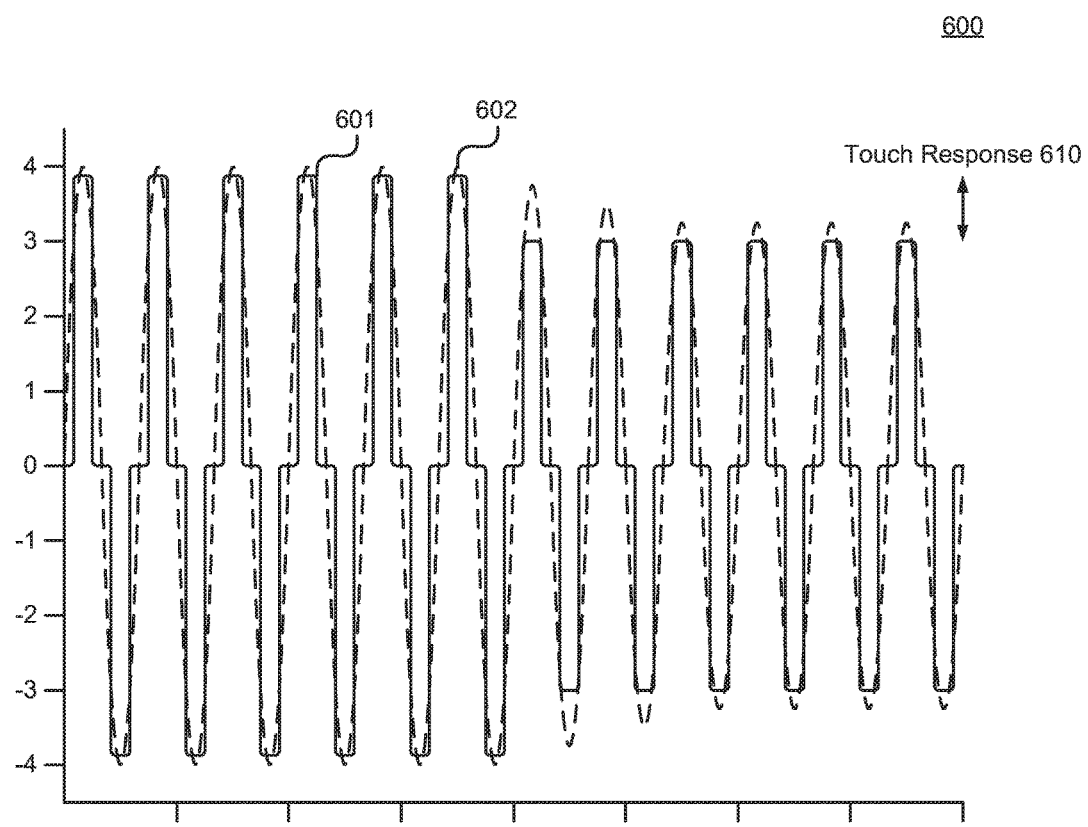
FIG. 6 illustrates waveforms for panel current and an output of a quantizer of a delta modulator receive channel, according to one embodiment.

FIG. 6 illustrates an embodiments of signals on panel 210 (FIG. 2) and the output of the IDAC (270 of FIGS. 2 and 423 and 427 of FIG. 4). As a conductive object is placed on panel 210, the current input to TIA 220 is reduced. The signals of FIG. 6 correspond to a mutual capacitance measurement circuit, wherein the input to TIA 220 is reduced. In self capacitance measurement circuits, illustrated in FIG. 5, have current inputs to TIA 220 that increases when a conductive object is placed on panel 210 (or a single electrode; $C_S$ 520) The current input to TIA 220 may be represented by square wave 601. The reduced amplitude of square wave 601 causes the amplitude of the current output of negative feedback loop 225 (through IDAC 270) to be reduced. The current output of negative feedback loop 225 may be represented by square wave 602. The reduction in the amplitude of signals 601 and 602 may be representative of the touch response 610 of a conductive object on panel 210 (of FIGS. 2 and 4).

Figure 7:
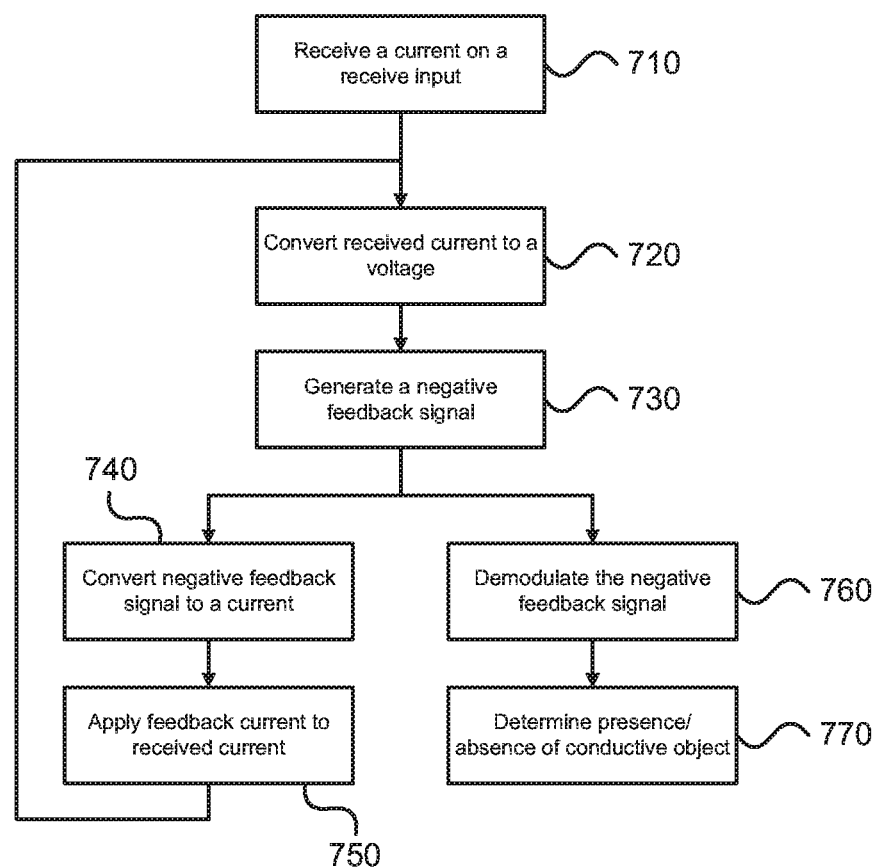
FIG. 7 illustrates a method for measuring capacitance with a delta modulator receive channel, according to one embodiment.

FIG. 7 illustrates a method 700 for converting a received signal from a capacitance sensing panel to a digital value. A current may be received on a receive input of a delta modulator receive channel at step 710. In one embodiment, current may be derived from a transmit signal and a mutual capacitance as discussed above with regard to FIG. 4. In another embodiment, the current may be derived from a self capacitance as discussed above with regard to FIG. 5. The received current from step 710 may be converted to a voltage at step 720. In one embodiment, the current may be converted to a voltage with a TIA, similar to TIA 220 (FIG. 2) and TIA 430 (FIG. 4, mutual capacitance; FIG. 5, self capacitance). A negative feedback signal may be generated in response to the output voltage of step 720 at step 730. In one embodiment negative feedback signal may be generated by a negative feedback loop similar to those illustrated in and discussed with regard to FIGS. 2, 4, and 5. The negative feedback signal of step 730 may be converted to a negative feedback current in step 740 and biased to the voltage level of the conversion circuit of step 720 (e.g., TIA 220 or TIA 430). At step 750, the biased negative feedback current of step 740 may be applied to the current received at step 710. In one embodiment, the biased negative feedback current of step 740 is applied to the current received at step 710 (and input to TIA 220 in one embodiment) through summing junction 215 (FIG. 2). The negative feedback signal of step 730 may be demodulated at step 760 to generate a digital value representative of the received signal. In one embodiment, the output of a BPF may be demodulated by a demodulator circuit as discussed with regard to FIG. 2, above. At step 770, the demodulated negative feedback signal of step 760 may be used to determine the presence or absence of a conductive object on the capacitive sensing panel (e.g., as described heretofore).

The embodiments described herein may be used in various designs of mutual-capacitance sensing arrays of the capacitance sensing system, or in self-capacitance sensing arrays. In one embodiment, the capacitance sensing system detects multiple sense elements that are activated in the array, and can analyze a signal pattern on the neighboring sense elements to separate noise from actual signal. The embodiments described herein are not tied to a particular capacitive sensing solution and can be used as well with other sensing solutions, including optical sensing solutions, as would be appreciated by one of ordinary skill in the art having the benefit of this disclosure.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments described herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A receive channel comprising:
   an input configured to receive a first signal from a receive electrode, wherein the first signal is a current induced on the receive electrode by a drive signal on a drive electrode and a mutual capacitance between the receive electrode and the transmit electrode;
   a conversion circuit configured to convert the first signal to a second signal, wherein the receive electrode is coupled to a first input of the conversion circuit and wherein a second input of the conversion circuit is coupled to a reference voltage;
   a quantizer circuit configured to convert the second signal to a bitstream;
   a filter circuit coupled to the quantizer and configured to provide a filtered output of the bitstream from the quantizer circuit;
   a current source coupled between the output of the filter circuit and the conversion circuit, the current source configured to provide a feedback current to an input of the conversion circuit; and
   a demodulation circuit coupled to the output of the filter circuit, the demodulation circuit configured to generate a static output of the receive channel.

2. The receive channel of claim 1, wherein the conversion circuit is a transimpedance amplifier.

3. The receive channel of claim 1, wherein the output of the filter circuit is offset to produce a nominal zero current at an input of the conversion circuit.

4. The receive channel of claim 1, wherein the filter circuit is a filter configured to isolate a fundamental signal from the output of the quantizer circuit.

5. The receive channel of claim 1, wherein the conversion circuit is configurable to operation in a mutual capacitance mode in a first mode and in a self capacitance mode in a second mode.

6. A receive channel comprising:
   an input configured to receive a first signal from a receive electrode, wherein the first signal from the receive electrode is a current induced on the self capacitance by the receive electrode coupled to the conversion circuit and the switching voltage potential;
   a conversion circuit configured to convert the first signal to a second signal, wherein the receive electrode is coupled to a first input of the conversion circuit and wherein a second input of the conversion circuit is coupled to a switching voltage potential;
   a quantizer circuit configured to convert the second signal to a bitstream;
   a filter circuit coupled to the quantizer and configured to provide a filtered output of the bitstream from the quantizer circuit;
   a current source coupled between the output of the filter circuit and the conversion circuit, the current source configured to provide a feedback current to an input of the conversion circuit; and
   a demodulation circuit coupled to the output of the filter circuit, the demodulation circuit configured to generate a static output of the receive channel.

7. The receive channel of claim 6, wherein the conversion circuit is a transimpedance amplifier.

8. The receive channel of claim 6, wherein the output of the filter circuit is offset to produce a nominal zero current at an input of the conversion circuit.

9. The receive channel of claim 6, wherein the filter circuit is a filter configured to isolate a fundamental signal from the output of the quantizer circuit.

10. The receive channel of claim 6, wherein the conversion circuit is configurable to operation in a mutual capacitance mode in a first mode and in a self capacitance mode in a second mode.

* * * * *